United States Patent [19]

Nystrom

[11] Patent Number: 5,003,252

[45] Date of Patent: Mar. 26, 1991

[54] APPARATUS AND METHOD FOR MEASURING POWER FACTOR AND TORQUE ON THE OUTPUT OF VARIABLE FREQUENCY DRIVES

[75] Inventor: Robert W. Nystrom, Oxford, Mass.

[73] Assignee: Load Controls Incorporated, Sturbridge, Mass.

[21] Appl. No.: 394,562

[22] Filed: Aug. 16, 1989

[51] Int. Cl.$^5$ ............... G01R 31/02; G01R 25/00
[52] U.S. Cl. ..................... 324/158 MG; 324/83 R
[58] Field of Search .......... 324/158 MG, 83 R, 83 A, 324/83 D, 862.33, 862.34, 862.08; 318/490, 798, 805; 322/99

[56] References Cited

U.S. PATENT DOCUMENTS

| | | | |
|---|---|---|---|
| 4,442,393 | 4/1984 | Abbondanti | 324/158 MG |
| 4,724,373 | 2/1988 | Lipo | 318/798 |
| 4,764,720 | 8/1988 | Nystrom | 324/107 |

FOREIGN PATENT DOCUMENTS 0167828  7/1986  Japan ................ 324/158 MG

Primary Examiner—Ernest F. Karlsen
Attorney, Agent, or Firm—Lorusso & Loud

[57] ABSTRACT

An apparatus and method for sensing power factor and torque on the output of a variable frequency machine is disclosed. Initially, power is sensed in each phase of the three-phase machine by utilizing Hall generators for multiplying the phase current flowing through each phase by a current proportional to a phase voltage for each phase. The products are then summed to obtain a reading of the instantaneous power drawn by the three phase machine. The AC component is filtered out of the summed signal using a multistage filter which allows for maintaining a fast response time with low ripple. This output is divided by the speed of the machine and multiplied by a constant to result in a signal representing torque. For measuring power factor, power signal sensed in each phase is applied to a DC blocking capacitor, effectively separating the AC envelope proportional to voltage times current. The three signals are applied to absolute value amplifiers and summed to provide a signal yielding total power. The instantaneous power is then divided by this signal to provide power factor.

13 Claims, 7 Drawing Sheets

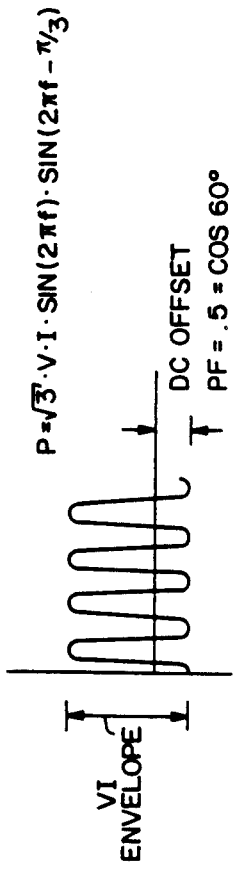
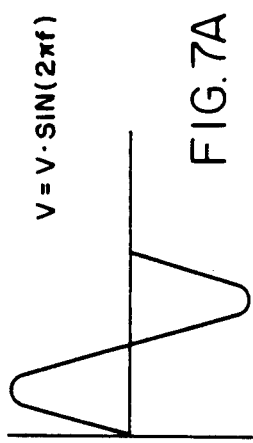
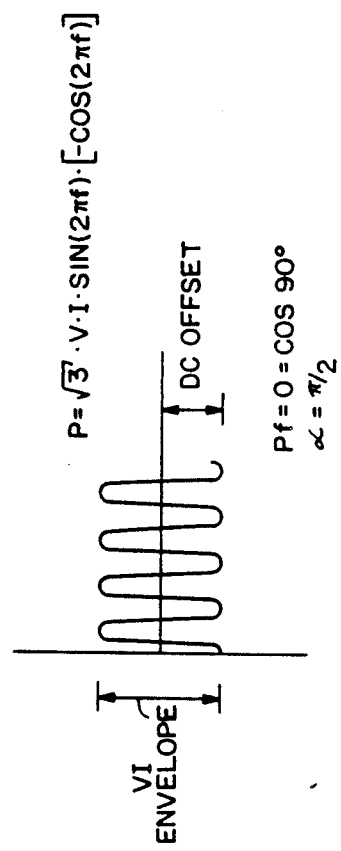
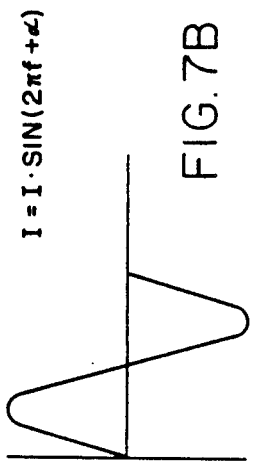
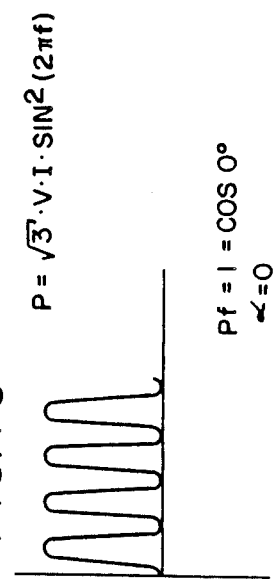

APPARATUS AND METHOD FOR MEASURING POWER FACTOR AND TORQUE ON THE OUTPUT OF VARIABLE FREQUENCY DRIVES

BACKGROUND OF THE INVENTION

The present invention relates to an apparatus and method for measuring power factor and torque on the output of variable frequency drives.

Adjustable speed drives have been in use for several years and they are widely used for controlling the speed of induction motors. Such adjustable speed drives offer several advantages over fixed speed drives For example, adjustable speed drives increase the productivity of industrial machines since the machine speed can be selected for maximum output consistent with good product quality. Adjustable speed drives also make industrial machines more flexible so that when a product change requires a different drive speed, the new speed is easily selected. This benefit eliminates the need for gear or belt ratio changes. Furthermore, electronic adjustable speed drive systems together with process or programmable controllers enable the controlling of machine speed, fan speed or pump speed thereby further increasing the productivity and versatility of any machine utilizing such adjustable frequency drives.

In general, motor speed can be controlled by varying factors such as line frequency, the number of motor poles, and motor slip. By controlling the motor speed by varying the frequency, a continuously variable, highly efficient control throughout the entire speed range may be achieved. Furthermore, such a control system is applicable to widely used, three-phase squirrel-cage motors.

Variable frequency may be provided to input terminals of an AC motor in the following manner. A main three-phase supply is first rectified and smoothed in a rectifier or converter section. This DC power is then fed into an inverter section, the current output of which approximates a sine wave of variable frequency and amplitude.

Two different methods of obtaining the variable frequency output may be used. In a six step system, Pulse Amplitude Modulation (PAM), the DC voltage obtained in the converter is varied. In a Pulse Width Modulation system (PWM), the frequency and the voltage are controlled by varying the pulse width within the invertor. The current output waveshape of the PWM system is superior to output wave forms produced by the PAM system. For both types of systems, the goal is to generate a current waveform that approaches sinusoidal with the harmonic components of the waveform at a minimum to ensure minimized torque pulsation and temperature rise. In neither case, however, has this goal been completely met by known devices.

In many situations, the effectiveness of a drive can be further increased by accurately measuring the power output. Measuring the instantaneous power input to a machine or process provides a great deal of valuable information. This measurement which can be used as a feedback signal may be utilized to: automatically adjust the machine feed rate; signal the beginning or end of a process; detect malfunctions or problems; and, indicate, without contact, the flow rate, viscosity or pressure.

Load controls that sense power, have set points and analog outputs are widely used in machine tools, chemical processes and material handling. Unfortunately, such load controls do not work on variable frequency sources. In order for a variable frequency power sensor to be of practical use as a machine controller, the sensor must have the ability to: accurately measure power at both low and high frequencies; provide a fast response with a low ripple and immunity to noise; and, have the capability of working on both pulse amplitude modulation drives and pulse width modulation drives.

The main use of variable speed drives is to power induction motors. To measure this power, the lag of the current behind the voltage (or power factor) must be considered. Traditional watt sensors rely on sensing the zero crossing of the sinusoidal voltage and current for power factor calculation. Typical waveforms from PWM and PAM drives show that the waveform is not clean enough for precise zero crossing measurement. A secondary problem is the measurement of current. Many sensors use a current sensing toroid or a lamination transformer, but these devices are not reliable at low frequencies. The combination of zero crossing and current measuring difficulties means that typical watt transducers do not work on the output of a variable frequency drive.

The measurement of AC power requires the multiplication of voltage, current and a power factor so that the equation is:

$$P = V \times I \times \cos \phi$$

A simple and reliable method for performing this computation electronically is by means of a Hall generator. A Hall generator is a magneto-sensitive semiconductor which, when driven by an electric current and exposed to a magnetic field, generates a voltage that is proportional to the product of current and field. To utilize a Hall generator to measure power, a Hall device excitation current I is derived from a line voltage, and the phase load current produces a proportional field B in the magnetic circuit. The Hall generator exposed to this field generates an output voltage proportional to the product of I, V, and the phase angle between them. The output contains an AC component and a DC component. The AC component can be filtered out if necessary, and the expression for the DC component is $V = k \times I \times B = k \times V \times I \cos \phi = k \times P$ where k is a constant representing the Hall voltage. The DC output voltage is therefore a measure of the AC power. With such additional power measurements as described above, only one or two phases are measured, and as a result, there is a large ripple component in the resulting output.

In three phase power measuring devices which are used for fixed frequency power sensors, either one or two transducers are utilized to measure either one phase under the assumption that the load is balanced or two phases, respectively. A computer simulation of either of these approaches at various power factors shows that the output would have a large ripple component which is unacceptable for control operations.

For many control applications, fast response is also critical. Typical response time for watt transducers is 250 to 500 milliseconds. The slow response is due in great part to filtering circuits. For a power sensor to be useful the response time should be reduced to about 15 milliseconds.

A power transducer must also live in close proximity to the variable frequency drive, and such drives generate a great deal of RF noise from the high frequency switching. Therefore, both the housing of the sensor and the internal circuitry should be designed to minimize RF noise.

In addition to sensing power of the variable frequency drive, it is often important to measure the torque produced by the drive. Torque is equivalent to the horsepower divided by the speed multiplied by a constant. After measuring the power produced by the variable frequency drive, a measurement of the speed of the drive through a speed transducer and dividing this into the horsepower allows one to determine the torque. Existing schemes for measuring torque are usually mechanical or implemented electronically with slow power transducers. Torque measurements are important in industry as they form the basis for understanding many mechanical phenomenon, and in particular are used to characterize electric motor performance.

Relative to electric motors, mechanical torque measurement methods fall into three general categories:
1. All mechanical.
2. Electronic strain gauges mounted on mechanical members.
3. Eddy current brakes.

In case 1, the classic Pony brake applies a friction load to the output shaft by means of woodblocks, flexible bands, or other friction surface devices. The torque is then measured by balancing the outputs against weights applied to a fixed lever arm. In case 2, a strain gauge is mounted directly to the shaft transmitting the power in the load. The shaft twists as a function of torque, the strain gauge deforms and a voltage output proportional to the torque results. In case 3 a rotating metal disc in a magnetic field induces eddy currents in the disc. These currents dissipate as heaL providing a value equal to horsepower; a tachometer provides a speed reference and division of the two results in torque measurement.

Methods 1 and 3 discussed above work fine for measuring torque but are not practical in all applications. The devices required to implement these methods are physically large, measure the torque output very slowly, and are cumbersome to implement. Strain gauges can be madé quite small and do respond rapidly, however, they have reliability problems associated with the wiring to the resistive bridge since the bridge is mounted on a rotating surface. Schemes for brush pickups or RF or inductive coupling have been used, but result in increased cost, slower response, more complexity and greater physical size. Installation costs are also high since it usually requires modification of the machine.

Another useful measure of variable frequency drive performance is power factor. There are many methods to compute power factor, but they all have shortcomings Generally they only work at one frequency (e.g. 60Hz), look at only one phase of a three phase system and only work with sinusoidal waveforms. With variable speed drives, distorted wave shapes are common and do not fare well with conventional power factor measurement techniques. Furthermore, most systems use a great deal of damping so that rapid or instantaneous measurements of power factor are not possible.

It is therefore a principal object of the present invention to provide an apparatus and method for sensing torque and power factor of a variable frequency drive that is accurate, reliable and which provides an output signal that does not exhibit a large ripple component.

It is another object of the present invention to provide an apparatus and method for measuring torque and power factor of a variable frequency drive which will be sensitive at both low and high frequencies and will provide a fast response time.

A further object of the present invention is to provide an apparatus and method for measuring torque and power factor of a variable frequency drive which Will provide independent and precise machine control and protection.

A still further object of the present invention is to provide an apparatus and method for sensing torque and power factor of a variable frequency drive which will provide a linear output and which is extremely forgiving to gross overloads.

Yet another object of the present invention is to provide a system for determining torque on either fixed frequency sources or variable speed drives.

A still further object of the present invention is to provide a method to compute power factor which works at more than one frequency.

Still another object of the present invention is to provide a method to compute power factor that will work on a variety of waveforms.

Yet another object of the present invention is to provide a method to measure power factor that is essentially instantaneous.

SUMMARY OF THE INVENTION

In accordance with the objects of the invention, an apparatus and method for measuring power factor and torque output on a variable frequency drive includes a means for measuring power in each phase of a three phase machine. The power is measured by taking the phase voltage from each phase, and converting the voltage into a control current. This controlled current and the appropriate phase is then utilized to drive a Hall generator so that the Hall generator multiplies the control current signal and the phase current signal to obtain an output signal that represents power ($V \times I \cos \phi$) in that particular phase. The power measurements from the three phases are summed to provide a measurement of the instantaneous power drawn by the three phase machine This power signal includes an AC component which is filtered out by a multistage filter and which allows the apparatus to maintain a rather fast response time. Preferably the multistage filter utilizes RC filters to perform the filtering operation.

Power Factor

After determining the power in each phase of the three phase motor, the three VI signals for each phase are summed; each is also applied to absolute value amplifiers. Dividing the power by the DC isolated absolute value of the same power instantly yields the power factor at that particular moment for the machine.

Torque

Speed measurements are made by attaching tachometers to the machine. Power and speed are divided which results in a signal proportional to torque. In addition, a circuit is provided to insure that division by zero cannot occur by setting a small threshold, typically 1/100 of the scale below which the denominator is clamped. In the case there is zero speed at zero power the numerator is zero and the output is zero. In the case of zero speed at full power (locked rotor), the result should be an infinite output as the denominator is taken to the zero limit, but as a practical matter, a full scale output accomplishes the same thing. The denominator of 1/100 full scale insures that a full scale reading would result in all real world conditions.

These and other features and objects of the present invention will be more fully understood from the following detailed description which should be read in light of the accompanying drawings in which corresponding reference numerals refer to corresponding parts throughout the several views.

BRIEF DESCRIPTION OF THE DRAWINGS

FIGS. 7A–7E show voltage and current graphs for measuring power factor.

DETAILED DESCRIPTION OF THE PREFERRED EMBODIMENTS

Figure 1:
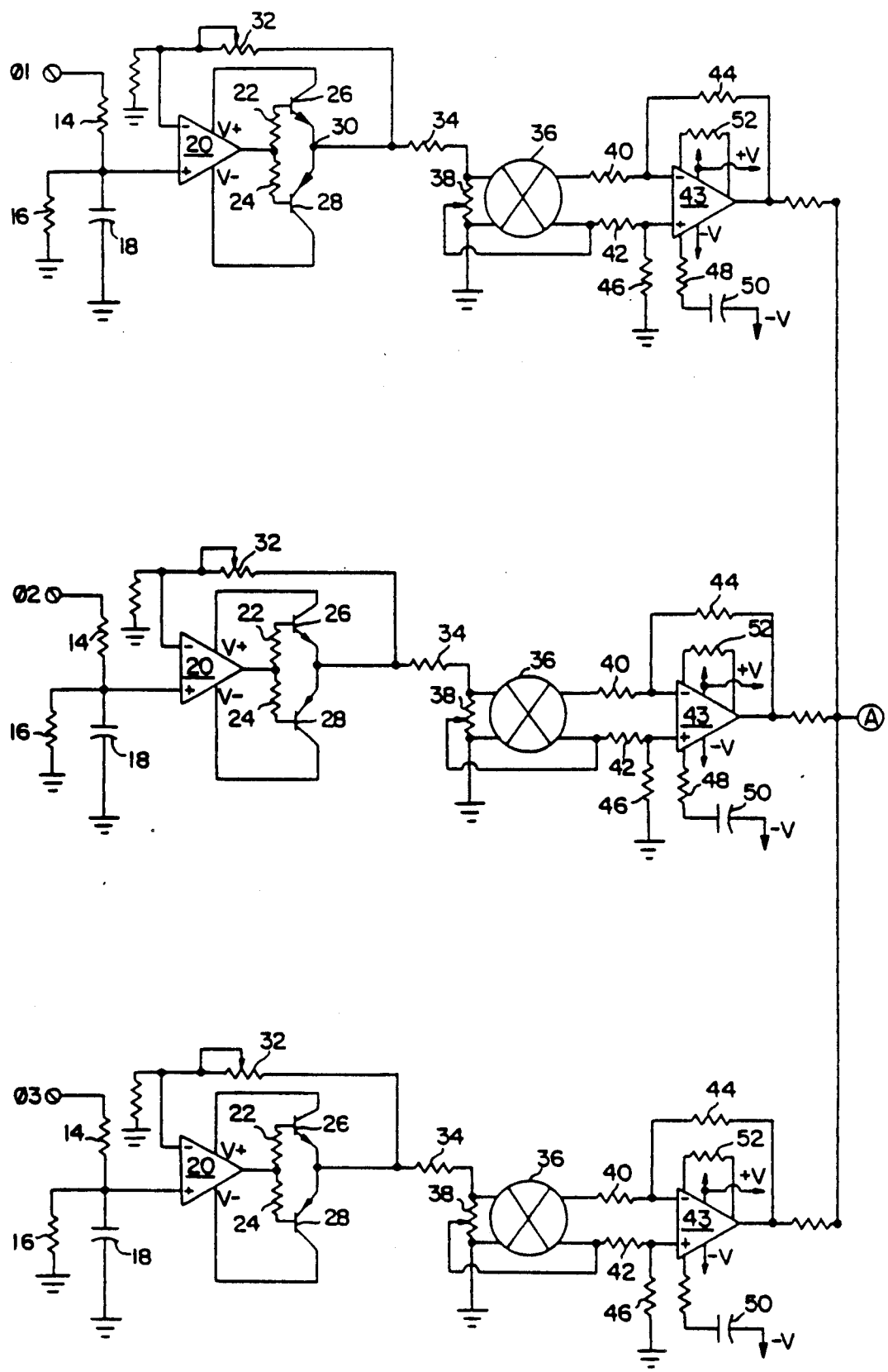
FIG. 1 is a schematic diagram of the circuitry for obtaining the power measurement in each of the three phases of the present invention.
Figure 2:
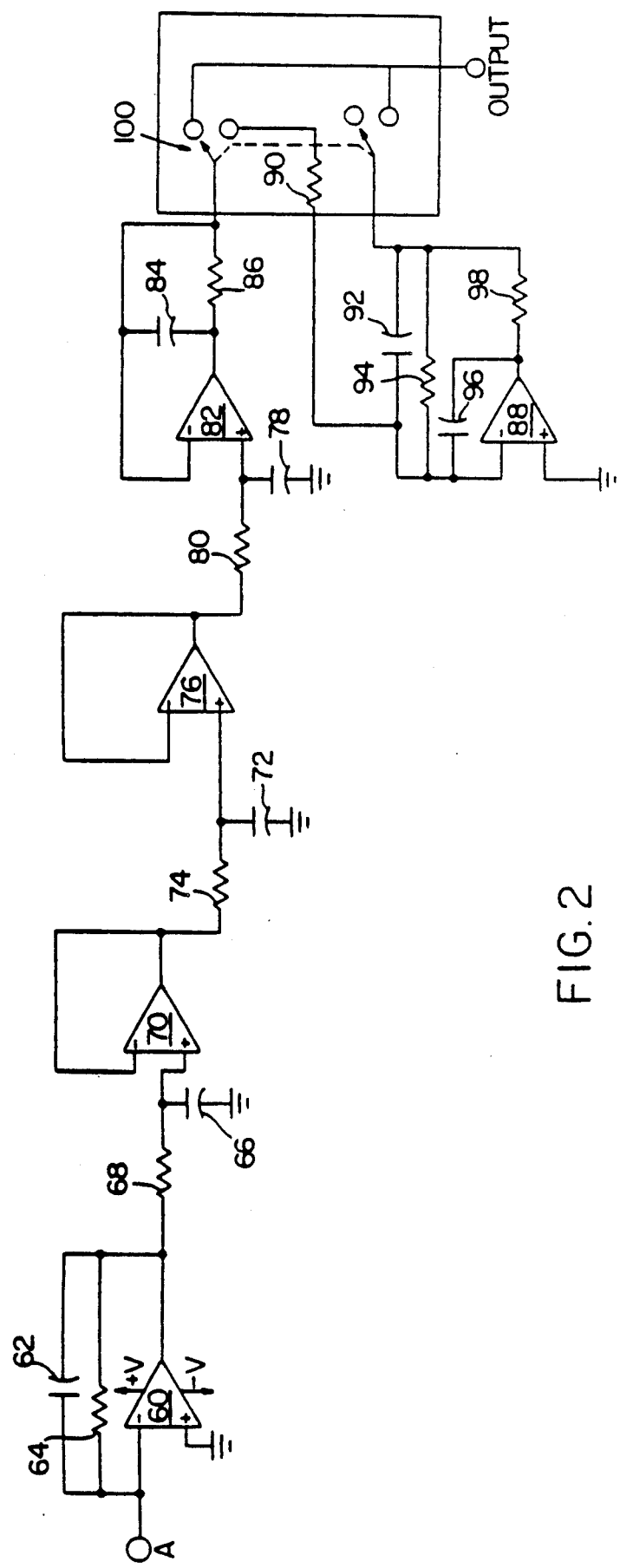
FIG. 2 is a schematic diagram of the multistage filter of the power sensor of the present invention.

Referring to FIGS. 1 and 2, the variable frequency power sensor of the present invention obtains a measure of a variable frequency power by independently measuring the power in each of the three phases and then summing the three power values. By measuring all three phases, the ripple is substantially reduced. The AC component of the resulting power measurement is filtered from the output by a multistage filter which is principally shown in FIG. 2.

Turning first to the phase measuring circuitry principally shown in FIG. 1, while the excitation for a Hall generator may be derived directly from phase voltage for a particular phase of a multi-phase machine by a voltage to current converting resistor, several problems would result with such a circuit. Principally, high power dissipation would occur, and there would be a high and potentially lethal leakage current since the current to ground from each phase is the excitation of the cell (typically 40 mA). To avoid these two problems, a high value resistor 14 is provided to limit the leakage current to microamps, and as a result, the circuit will exhibit a lower power dissipation (approximately 0.25 watts). Resistor 14 will also facilitate the normalizing of the range voltage with the divider resistor 16. Capacitor 18 is provided to supply high frequency noise filtering and op-amp 20 which is characterized by a high breakdown voltage and good common mode characteristics will also have a slew rate which will provide some high frequency noise filtering. Only a minimal amount of filtering is required to preserve the accuracy of the reproduced waveform presented to the Hall cell. A LM324 operational amplifier as manufactured by National Semiconductor is suitable for this purpose.

The op-amp 20 output is sent through resistors 22, 24 to the base of transistors 26, 28 which are provided to buffer the op-amp output transistors. The output from the two transistors are combined at summing point 30, and this output signal provides a negative feedback voltage through variable resistor 32 to the inverting input of the op-amp 20. The feedback resistor 32 is a variable resistor because this resistor is used for Hall cell calibration. The output voltage from the summing point 30 passes through resistor 34 which may be a temperature compensating resistor for Hall cell stabilization. Resistor (and consequently gain) values are computed to prevent damage to the Hall cell from gross overloads.

The Hall generator 36, which is supplied with the total current of a particular phase, is modulated by the appropriate excitation current to produce a power proportional signal. A suitable Hall device will saturate at a fixed current, and an example of such a Hall generator is that manufactured by FW Bell under the designation PI100 and PI350.

Variable resistor 38 balances the bridge voltage of the Hall cell 36 and the variable resistor 38 may be calibrated dynamically by oscilloscope observation of $Sin^2 \omega t$. Output voltages of the Hall cell 36 are supplied through resistors 40 and 42 to the inverting and non-inverting inputs of op-amp 43 respectively. Op-amp 43 is a low noise, high speed op-amp which is configured for differential gain to take advantage of common mode rejection. A suitable op-amp would be a LM725 manufactured by National Semiconductor. Resistors 44 and 46 are selected to set an appropriate gain, and the combination of resistor 48 and capacitor 50 set compensation and provide a certain amount of filtering. Resistor 52 nulls the amplifier 43. The output of the amplifier 43 provides a signal representing the power in the particular phase to which it is connected.

The phase signals from each of the three phases must be summed, and amplifier 60 is provided for this purpose. As discussed above, the AC component must be filtered from the output wave, and once the signals from three phases are summed by amplifier 60, the voltage signal representing the sum is filtered to remove the AC component. In order to maintain a fast response time, a multistage filter is utilized which will provide a response time of approximately 15 milliseconds. The first stage of filtering is effected by an RC filter circuit comprising capacitor 62 and resistor 64. Op-amp 60 will provide a voltage source signal for the next RC stage comprising capacitor 66 and resistor 68. By utilizing the amplifier 60 to provide the voltage source for the RC filter comprising capacitor 66 and resistor 68, the overall construction is simplified and the attenuation effects normally associated with multistage RC filters are thereby reduced. In the preferred embodiment shown in FIG. 2, there are four stages of filtering which will enable the rapid decrease of ripple per stage with a very slow increase in the response time. In the remaining filtering stages, amplifier 70 provides a voltage source for the RC circuit comprising capacitor 72 and resistor 74, and op-amp 76 will feed a voltage signal to the RC circuit comprising capacitor 78 and resistor 80. Amplifier 82 is used to buffer the last filter stage, and the RC circuit comprising capacitor 84 and resistor 86 is provided to increase the stability phase margin when driving long capacitive cables.

In a preferred embodiment there are two output signals modes. One will provide an output from 0 to approximately −7 volts which is used for additional signal processing by other "black boxes". If the device is used for a regenerative motor, the polarity reverses to 0 to +7 volts full scale. In a stand-alone mode which is used for power indication only, amplifier 88 is provided for transducer output scaling and additional filtering. Resistors 90 and 94 set the gain and therefore the scaling along with inverting amplifier 88. Resistor 90 and the equivalent of DPDT switch 100 is located on a plug-in module. Switch 100 selects whether the output signal comes from amplifier 82 or 88. Resistor 94 and capacitor 92 provide one more stage of filtering in the transducer stand alone mode. Resistor 98 and capacitor 96 decouple amplifier 88 from capacitive loads. Scaling may be provided by a plug-in module as well as by model selection. Typically the output is scaled to 0 to +10 volts or 0 to +5 volts full scale. Polarity reverses (0 to −10 volts, 0 to −5 volts full scale) for regenerative motors.

With respect to the power supply for the present invention, any conventional power supply may be utilized. In one embodiment, the power supply may be a split supply which will provide for op-amp ripple rejection and optimization of common mode rejection in amplifiers 43. Rail voltages can be chosen to provide low dissipation for the op-amps and to limit the output signal in the event of gross overloads through the Hall cell. This allows the Hall cell 36 to be greatly undersized to provide maximum sensitivity at a small part of the machining cycle without the fear of damage at higher normal cycle loads.

Torque Measurement

Torque is equal to horsepower divided by the speed multiplied by a constant. The schematic shown in FIG. 1 may be coupled with a speed transducer and a divider circuit to calculate torque. Speed measurements made by attaching tachometers to the machine or motor is a relatively noninvasive machine procedure. Power measurement by the circuit shown in FIG. 1 and described above and processing of the resulting signal completes the system and results in the signal proportional to torque. Power transducers are not new but as pointed out in FIG. 1, the schematic works with either fixed frequency sources or variable speed drives.

Figure 3:
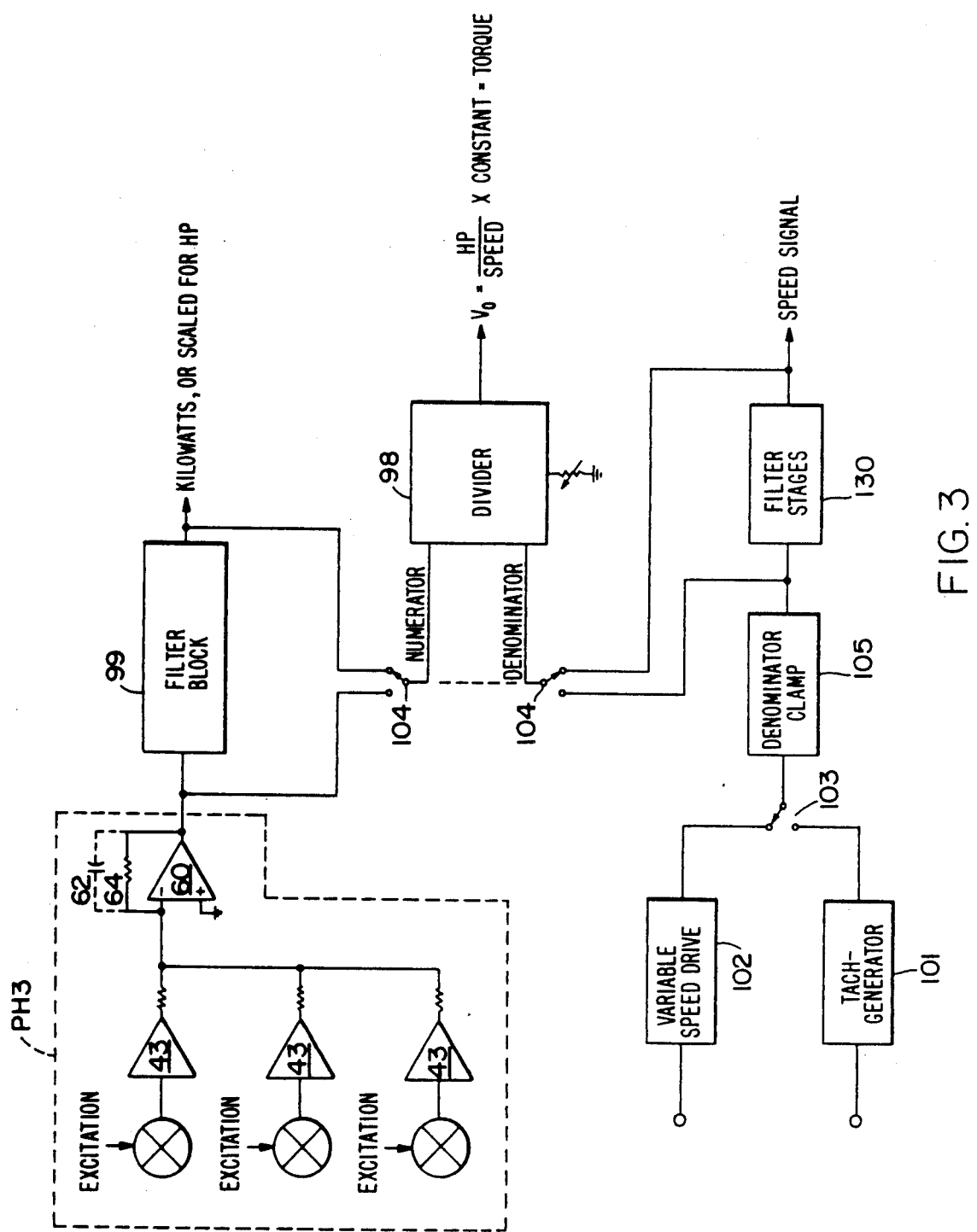
FIG. 3 shows a block diagram for measuring torque.

As shown in FIG. 3, the speed signal may come from one or two sources, i.e., either tach generator 101 or from the variable speed drive 102. Tach generators 101 are common, and with fixed frequency applications they represent the best approach. Output from a tachometer is generally in the 7 volts per 1000 rpm range, and input conditioning is provided in the first stage. Input conditioning is noise filtering and voltage level scaling of the input signal to match the following circuits. When variable speed drives are present, another route is possible. Drives are generally equipped to provide a voltage output signal (typically 1 to 5 volts) that is proportional to the frequency of the motor drive. In the case of a synchronous motor, this is exactly equal to the rotor speed; in the case of an induction motor, there is a small error due to slip. The slip error may generally be disregarded. The benefits of using the signal are increased system reliability (no mechanical tachometer) and installation simplicity. Signal conditioning and scaling are provided by the appropriate input stage, that is, it is switch selectable by switch 103.

The problem of zero speed of the variable frequency drive or motor creates a problem as division by zero is not possible. When zero speed occurs, two possibilities exists:

(1) zero speed at zero power; and
(2) zero speed at full power.

A circuit is provided as shown as denominator damp 105 in FIG. 3 to insure that division by zero cannot occur by setting a small threshold, typically 1/100th of scale, below which the denominator is clamped. In case number 1, the numerator is zero and the output is zero. In case number 2, the result would be an infinite output as the denominator is taken to the zero limit; however, as a practical matter, a full scale output accomplishes the same thing. A denominator of 1/100th of scale insures that full scale would result in all real world conditions.

Figure 4:
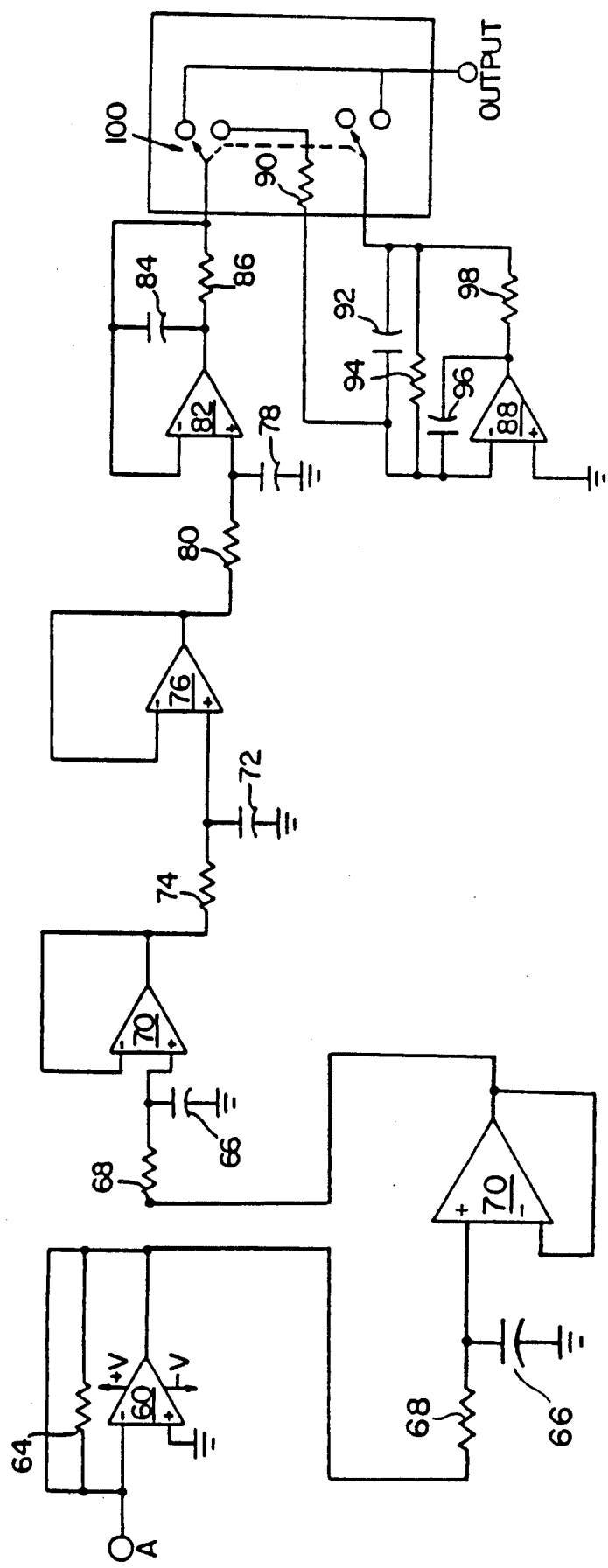
FIG. 4 is a schematic diagram of the multistage filter of the torque sensor of the present invention.

Power measurement is made as described in FIGS. 1 and 2. The electrical circuit is represented schematically by the area enclosed in the dotted line and labeled PH-3 in FIG. 3. A small change is made in the filtering stage of FIG. 2 by omitting the integrating capacitor 62. Changing the filter stage results in an extremely fast response time. To maintain the four stage filter in the filtering stage, another filter stage is added to the filter block 99 and 15 shown in FIG. 4. The selector switch 104 in FIG. 3 couples either the instantaneous value or the filtered value to the divider 98. This block divides the power measurement by the speed and multiplies this total by a constant to give the instantaneous or average torque in desired units (Ft-lbs, Newton-meters, etc.). As in FIG. 2, the filter in FIG. 4 provides very low ripple with fast response time, approximately 15 milliseconds. Full scale voltage and current are adjusted by plug-in networks comprised of components 16, 44, 46, 48, and 50, shown in FIG. 1. Changing resistors 16 changes the voltage (either 230 volt, 460 volt or greater), changing the others affects the current. These plug-ins make field changes simple and accurate as discussed above.

Scaling for units is provided at the divider 98. The output is a signal proportional to torque.

Power Factor

Power factor is the phase difference between the line voltage and the current. It is expressed as a number between zero and one; one indicating a totally resistive load, and zero indicating a totally reactive load. The power factor is mathematically expressed as $\cos \phi$. Totally reactive loads have a phase shift of 90 degrees ($\cos \phi = 0$), while resistive loads have a shift of 0 degrees ($\cos \phi = 1$). Totally reactive capacitive loads cause the current to lead the voltage by 90 degrees while totally reactive inductive loads cause the current to lag the voltage by 90 degrees. Power in watts for a three phase line is expressed as the product of voltage, current and power factor and the square root of 3. That is, power equals voltage multiplied by current multiplied by power factor multiplied by the square root of three. Since power factor is the ratio of real power to total power, the voltage, current and square root of three must be eliminated from the equation. The ratio is expressed from zero to one, is dimensionless and is mathematically represented as $PF = (V \cdot I \cdot \cos\phi \cdot \sqrt{3})$ divided by $(V \cdot I \cdot \sqrt{3})$.

Since the Hall device measures the strength of a magnetic field present inside of a torridal flux concentrator, the magnetic flux in the torrid gap is proportional to current. To generate an output signal, the Hall device must be excited by an external current. The Hall voltage output is the product of these two signals. The output signal is generally small (millivolts), essentially independent of frequency (DC to MHz in some designs) and by definition considers the phase of the two input signals.

Figure 5:
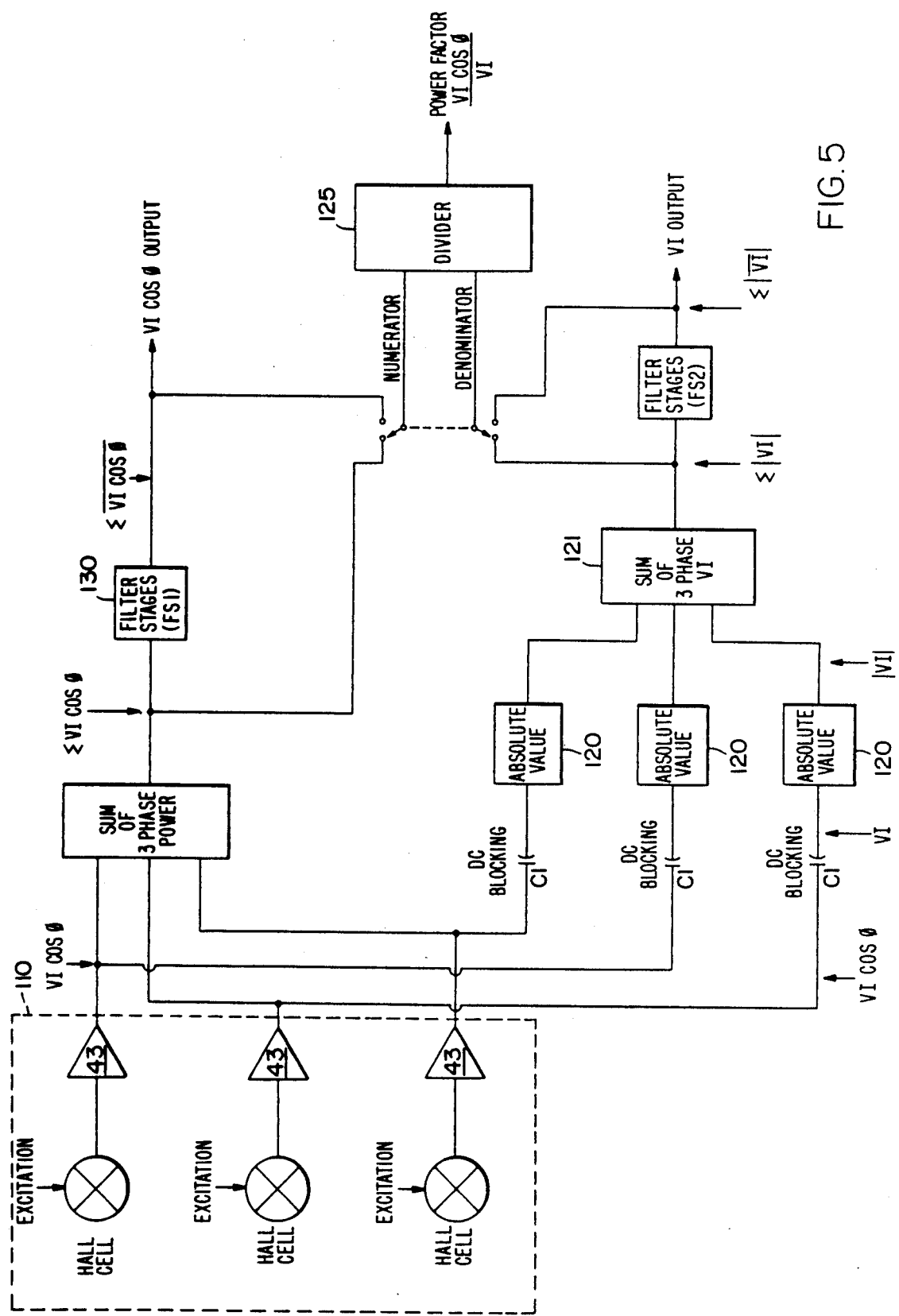
FIG. 5 is a block diagram for measuring power factor.
Figure 6:
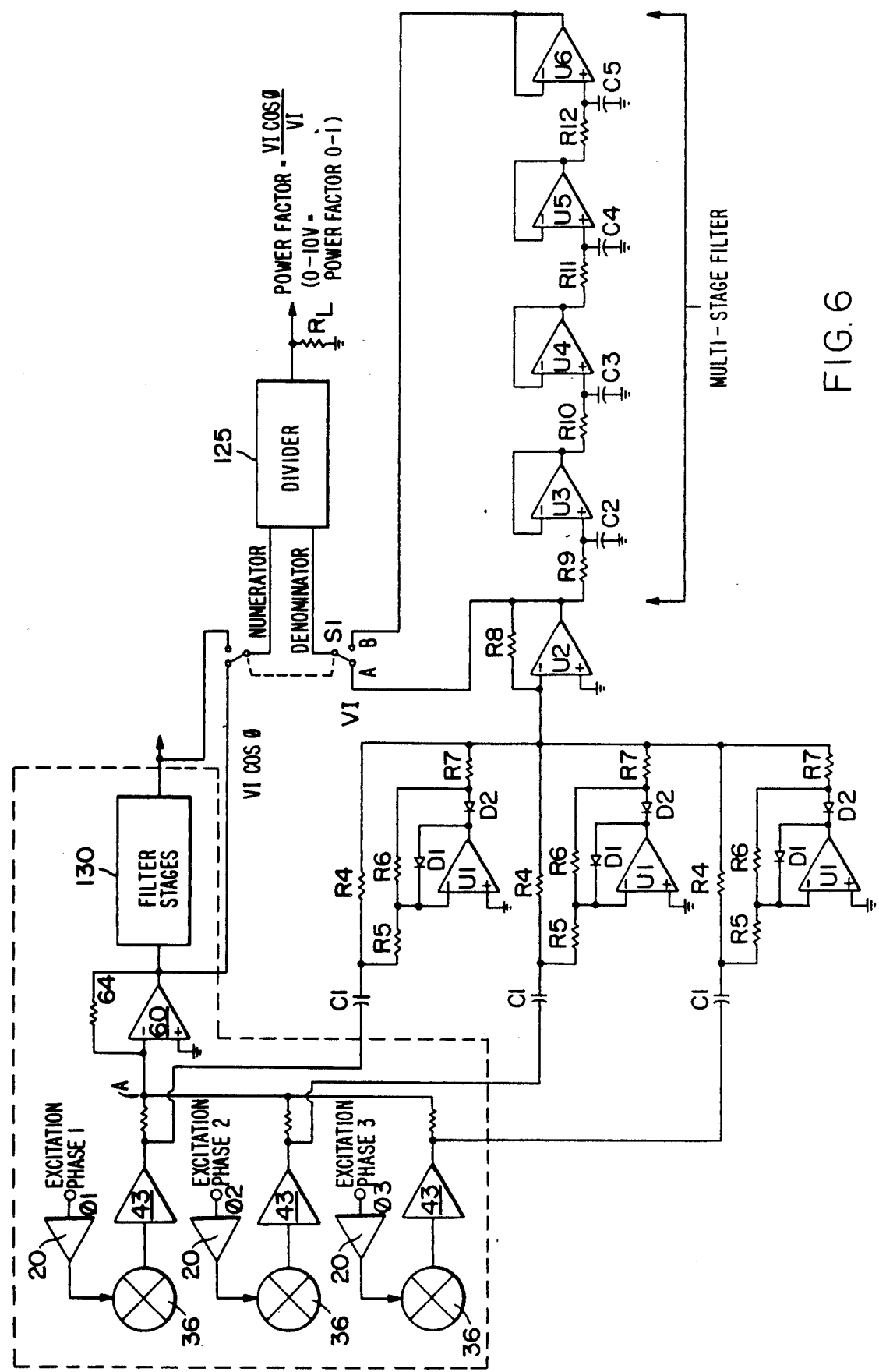
FIG. 6 is a schematic of the power factor sensor of the present invention.

FIG. 5 is a block diagram showing the measurement of power factor. The numbers in FIGS. 5 and 6 are the same for the same components found in FIGS. 1 and 2.

As discussed, the Hall cell 36, the excitation circuit 20 and the amplification 43 are shown in FIG. 1. This is represented by block 110 in FIG. 5 and schematically in FIG. 6. Filter stages 130, shown in FIG. 5, are the same as that disclosed in FIG. 2 with the exception that capacitor 62 is omitted. Since it is necessary that four stages of filtering be included, and since capacitor 62 is one of those stages, the filter string needs to be increased by one. This is accomplished by inserting another set of components 66, 68 and 70 as shown in FIG. 4.

The basis for this invention lies in the way the signals representing voltage and current are handled after they are multiplied. For this discussion, it is assumed that both the currents and the voltages are represented by sinusoidal waveforms.

Voltage (FIG. 7A): $V = V \cdot \sin(2\pi f)$

Current (FIG. 7B): $I = I \cdot \sin(2\pi f + \alpha)$, where $\alpha$ = phase angle.

Line voltage is presented to the Hall cell as excitation and the current is measured as the flux density in the core. Due to the physics of the Hall cell, it acts as a multiplier; the resultant Hall output voltage is proportional to power:

$$P = V \cdot \sin(2\pi f) \cdot I \cdot \sin(2\pi f + \alpha) \quad (1)$$

The $\sqrt{3}$ term is now introduced as a constant, and the terms rearranged:

$$P = \sqrt{3} \cdot V \cdot I \left[ \sin(2\pi f) \sin(2\pi f + \alpha) \right] \quad (2)$$

For a resistive load $\alpha = 0$ degrees, PF = 1, and power is:

$$P = \sqrt{3} \cdot V \cdot I \cdot \sin^2(2\pi f) \text{ (FIG. 7C)} \quad (3)$$

For a fully reactive lagging load, $\alpha = -90$ degrees and PF = 0. Since $\sin(2\pi f - \pi/2) = -\cos(2\pi f)$, then:

$$P = \sqrt{3} \cdot V \cdot I \cdot \sin(2\pi f) \cdot [-\cos(2\pi f)] \text{(FIG. 7E)} \quad (4)$$

Note from FIG. 7D that the V-I envelope has developed a DC offset in the negative direction relative to FIG. 7C. This offset is due to the $\cos(2\pi f)$ term in Equation 4. Most importantly, note that the amplitude of the V-I envelope remains constant regardless of phase shift. This amplitude can be shown to be:

$$\text{Amplitude} = \sqrt{3} \cdot V \cdot I \cdot [\tfrac{1}{2} \sin(4\pi f)] \quad (5)$$

Equation 5 shows that eliminating the DC component from the output of the Hall cell results in a quantity proportional to V·I independent of power factor. The DC component can be blocked by a capacitor. With appropriately scaling, dividing the signals before and after the capacitor yields power factor.

Before capacitor:
$$V_{signal} = \sqrt{3} \cdot V \cdot I \cos \pi \quad (6)$$

After capacitor
$$V_{signal} = \sqrt{3} \cdot V \cdot I \quad (7)$$

Dividing and cancelling terms:

$$\frac{V_{sig} \text{ before cap}}{V_{sig} \text{ after cap}} = \frac{\sqrt{3} \cdot V \cdot I \cdot \cos\phi}{\sqrt{3} \cdot V \cdot I} = \cos\phi \quad (Eq\ 8)$$

By definition $$\cos \pi = PF \quad (9)$$

To understand implementation of the device, refer to the block diagram on FIG. 5. The output of op-amp 43 is the output of the cell, equal to VI cos $\phi$. This signal is applied to a DC blocking capacitor (C1), effectively separating the AC envelope proportional to VI. Since this is intended for a three phase line, all three phases are monitored; this has the advantage of showing the total instantaneous power factor. Simply summing the three V·I signals would cause the output to be zero as the three lines have a 120 degree phase shift. To avoid this, the three outputs are applied to absolute value amplifiers 120. Summing both VI cos $\phi$ and VI has a distinct advantage with three phase lines in that these values sum to a constant DC level (any ripple left in the signal is due to line phase imbalances). Applying the signals to a divider 125 yields power factor computations instantaneously (Eqs 7-9). The feed to the divider from the V I summer 121 may also be taken after the four stage filters shown in FIG. 5 for averaging out line noises and still maintaining fast response times (15 milliseconds).

Note that the above discussion applies equally as well to other waveshapes and frequencies. Once again, the only changes to circuits of FIGS. 1 and 2 are the omission of the first VI cos $\phi$ integrating capacitor 62 on op-amp 60. To maintain the 4 stage filtering shown in FIG. 2, one more stage has been added to the remaining filter stages in FIG. 4. In addition, full scale power voltage and current ranges are changed by plug in networks. Voltage networks contain resistor #16; this sets the full scale line voltage (230v, 460v, etc). Currents are set by components 44, 46, 48 and 50; for example 10A, 30A, 100A. This arrangement makes field changes simple and accurate. Networks (or modules) are discussed above.

While the foregoing invention has been described with reference to its preferred embodiments, various alterations and modifications may occur to those skilled in the art. All such alterations and modifications are intended to fall within the scope of the appended claims.

What is claimed is:

1. A torque sensor for determining torque through a wide bandwidth of frequencies, continuously and automatically, at any moment in time in a three-phase AC machine with speed to produce a resulting signal, said resulting signal representing sensed torque as an analog function, said torque sensor producing said signal within milliseconds, said sensor comprising:

means for measuring power in each phase of said three-phase AC machine, said means for measuring power being capable of measuring distorted and non-distorted sinusoidal and non-sinusoidal wave shapes while maintaining sensitivity at high and low frequencies, said means for measuring power including:

means for detecting a phase current from said phase of said three-phase AC machine to obtain a phase current signal;

means for detecting a phase voltage from said phase of said three-phase AC machine to obtain a phase voltage signal;

means for amplifying said phase voltage signal, said means for amplifying said phase voltage signal also acting to convert said phase voltage signal into a control current proportional to the phase voltage signal in amplitude and phase, said control current being temperature compensatable by means of a temperature compensating resistor; and a Hall generator driven by said control current, said Hall generator configured and adapted to sense a magnetic field generated by the phase current signal, said Hall generator providing an output signal indicative of instantaneous power drawn by said phase of said three-phase AC machine;

said three-phase AC machine providing a summed output signal, said summed output signal being composed of a DC component and an AC component;

means for filtering said AC component from said summed output signal of said three-phase AC machine providing a filtered linear DC output signal, said means for filtering including at least four consecutive stages of filters, each of said stages of filters including an RC filter, said means for filtering capable of maintaining a ripple of about 1%;

means for measuring speed of the AC machine;

means for dividing the filtered linear DC output signal by the measured speed to provide an output proportional to torque of the machine.

2. The torque sensor according to claim 1 with means for compensating the measured speed such that the compensated measured speed is not permitted to equal zero.

3. The torque sensor according to claim 1 wherein the means for measuring speed of the AC machine produces a frequency proportional signal from the variable speed drive.

4. A power-factor sensor for sensing power-factor through a wide bandwidth of frequencies, continuously and automatically, at any moment in time in a three-phase AC machine to produce a resulting signal, said resulting signal representing power-factor, said power-factor sensor producing said signal within milliseconds, said sensor comprising:

means for measuring power in each phase of said three-phase AC machine, said means for measuring power being capable of measuring distorted and non-distorted sinusoidal and non-sinusoidal wave shapes while maintaining sensitivity at high and lower frequencies, said means for measuring power including:

means for detecting a phase current from said phase of said three-phase AC machine to obtain a phase current signal;

means for detecting a phase voltage from said phase of said three-phase AC machine to obtain a phase voltage signal;

means for amplifying said phase voltage signal, said means for amplifying said phase voltage signal also acting to convert said phase voltage signal into a control current proportional to the phase voltage signal into a control current proportional to that phase voltage signal in amplitude and phase, said control current being temperature compensatable by means of a temperature compensating resistor; and a Hall generator driven by said control current, said Hall generator configured and adapted to sense a magnetic field generated by the phase current signal, said Hall generator providing an output signal indicative of instantaneous power drawn by said phase of said three-phase AC machine;

said three-phase AC machine providing a summed output signal, said summed output signal being composed of a DC component and an AC component;

means for filtering said AC component from said summed output signal of said three-phase AC machine providing a filtered linear DC output signal, said means for filtering including at least four consecutive stages of filters, each of said stages of filters including an RC filter, said means for filtering capable of maintaining a ripple of about 1%;

means for blocking the DC component of each phase voltage signal and applying each output to an absolute value amplifier to produce a signal proportional to voltage multiplied by current;

means for summing each signal proportional to voltage multiplied by current to produce a total power signal;

means for filtering said total power signal, said means for filtering including at least four consecutive stages of filters each of said stages including an RC filter, said means for filtering capable of maintaining a ripple of approximately 1%; and means for dividing the signal by the filtered linear DC output signal to produce a signal representing average power-factor.

5. A power factor sensor for sensing power-factor through a wide bandwidth of frequencies, continuously and automatically, at any moment in time in a three-phase AC machine to produce a resulting signal, said resulting signal representing sensed power-factor as an analog function, said power-factor sensor producing said signal within milliseconds, said sensor comprising:

means for measuring power in each phase of said three-phase AC machine, said means for measuring power being capable of measuring distorted and non-distorted sinusoidal and non-sinusoidal wave shapes while maintaining sensitivity at high and low frequencies, said means for measuring power including:

means for detecting a phase current from said phase of said three-phase AC machine to obtain a phase current signal;

means for detecting a phase voltage from said phase of said three-phase AC machine to obtain a phase voltage signal;

means for amplifying said phase voltage signal, said means for amplifying said phase voltage signal also acting to convert said phase voltage signal into a control current proportional to the phase voltage signal in amplitude and phase, said control current being temperature compensatable by means of a temperature compensating resistor; and a Hall generator driven by said control current, said Hall generator configured and adapted to sense a magnetic field generated by the phase current signal; said Hall generator providing an output signal indicative of instantaneous power drawn by said phase of said three-phase AC machine;

means for blocking the DC component of each phase voltage signal and applying each output to an absolute value amplifier to produce a signal proportional to voltage multiplied by current;

means for summing each signal proportional to voltage multiplied by current to produce a total power signal proportional to VI;

said three-phase AC machine providing a summed output signal, said summed output signal being composed of a DC component and an AC component; and means for dividing the absolute power signal by the summed output signal to provide a signal representing instantaneous power factor.

6. A sensor for power-dependent parameters, said sensor comprising:

means for measuring power in each phase of a three-phase AC machine having speed, said means for measuring power being capable of measuring distorted and non-distorted sinusoidal and non-sinusoidal wave shapes while maintaining sensitivity at high and lower frequencies, said means for measuring power including:

means for detecting a phase current from a phase of said three-phase AC machine to obtain a phase current signal;

means for detecting a phase voltage from a phase of said three-phase AC machine to obtain a phase voltage signal;

means for amplifying said phase voltage signal, said means for amplifying the phase voltage signal also acting to convert the phase voltage signal into a control current proportional to the phase voltage signal in amplitude and phase, said control current being temperature compensatable by means of a temperature compensating resistor; and a Hall generator driven by said control current, said Hall generator configured and adapted to sense a magnetic field generated by the phase current signal, said Hall generator providing an output signal indicative of instantaneous power drawn by said phase of said three-phase AC machine;

said three-phase AC machine providing a summed output signal, said summed output signal being composed of a DC component and an AC component; and means for filtering said AC component from said summed output signal of said three-phase AC machine providing a filtered linear DC output signal, said means for filtering including at least four consecutive stages of filters, each of said stages of filters including an RC filter, said means for filtering capable of maintaining a ripple of about 1%.

7. The sensor of claim 6 where the power-dependent parameters are torque and power-factor.

8. A sensor in accordance with claim 6, wherein the power-dependent parameter is torque, said sensor sensing torque through a wide bandwidth of frequencies, continuously and automatically, at any moment in time in the three-phase AC machine to produce a resulting signal, said resulting signal representing sensed torque as an analog function, said sensor producing the resulting signal within milliseconds, said sensor comprising:

means for measuring speed of the AC machine;

means for dividing the filtered linear DC output signal by the measured speed to produce an output signal being proportional to said sensed torque of the AC machine.

9. The torque sensor according to claim 8 with means for compensating the measured speed such that the compensated measured speed is not permitted to equal to zero.

10. The torque sensor according to claim 8 wherein the means for measuring speed of the AC machine produces a frequency proportional signal from the AC machine.

11. The torque sensor according to claim 10 wherein the AC machine is a variable frequency drive.

12. A sensor in accordance with claim 6, wherein the power-dependent parameter is power-factor, said sensor sensing power-factor through a wide bandwidth of frequencies, continuously and automatically, at any moment in time in a three-phase AC machine to produce a resulting signal, said resulting signal representing sensed power-factor, said power-factor sensor producing said signal within milliseconds, said sensor comprising:

means for blocking the DC component of each phase voltage signal and applying each output to an absolute value amplifier to produce a signal proportional to voltage multiplied by current;

means for summing each signal proportional to voltage multiplied by current to produce a total power signal;

means for filtering said total power signal, said means for filtering including at least four consecutive stages of filters, each of said stages including an RC filter, said means for filtering capable of maintaining a ripple of approximately 1%; and means for dividing the signal by the filtered linear DC output signal to produce an output signal being representative of sensed average power-factor of the AC machine.

13. A sensor in accordance with claim 6, wherein the power-dependent parameter is power-factor, said sensor sensing power-factor through a wide bandwidth of frequencies, continuously and automatically, at any moment in time in a three-phase AC machine to produce a resulting signal, said resulting signal representing sensed power-factor being a continuous analog function, said power factor sensor producing said signal within milliseconds, said sensor comprising:

means for blocking the DC component of each phase voltage signal and applying each output to an absolute value amplifier to produce a signal proportional to voltage multiplied by current;

means for summing each signal proportional to voltage multiplied by current to produce a total power signal;

means for dividing the absolute power signal by the summed output signal to produce an output signal being representative of sensed instantaneous power-factor of the AC machine.

* * * * *

UNITED STATES PATENT AND TRADEMARK OFFICE
CERTIFICATE OF CORRECTION

PATENT NO. : 5,003,252
DATED : March 26, 1991
INVENTOR(S) : Robert W. Nystrom

It is certified that error appears in the above-identified patent and that said Letters Patent is hereby corrected as shown below:

```
Column 3, line 34:    replace "heaL" with --heat--;
Column 3, lines 53 to 54:   insert --. -- after "shortcomings".

Column 9, line 46:    replace "π" with --φ--;
Column 9, line 56:    replace "π" with --φ--.
```

Signed and Sealed this

Twelfth Day of January, 1993

Attest:

DOUGLAS B. COMER

*Attesting Officer*    Acting Commissioner of Patents and Trademarks